(12) United States Patent
Kubena et al.

(10) Patent No.: US 10,819,276 B1
(45) Date of Patent: Oct. 27, 2020

(54) BROADBAND INTEGRATED RF MAGNETIC ANTENNA

(71) Applicant: HRL Laboratories, LLC, Malibu, CA (US)

(72) Inventors: Randall L. Kubena, Oak Park, CA (US); Walter S. Wall, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 17 days.

(21) Appl. No.: 16/370,602

(22) Filed: Mar. 29, 2019

Related U.S. Application Data

(60) Provisional application No. 62/678,897, filed on May 31, 2018.

(51) Int. Cl.
*H01Q 23/00* (2006.01)
*H03B 5/04* (2006.01)
(Continued)

(52) U.S. Cl.
CPC ............. *H03B 5/04* (2013.01); *G01R 33/02* (2013.01); *H01Q 23/00* (2013.01); *H03B 5/32* (2013.01);
(Continued)

(58) Field of Classification Search
CPC .................................. H01Q 23/00; H03B 5/04
See application file for complete search history.

(56) References Cited

U.S. PATENT DOCUMENTS

| 4,314,204 A | 2/1982 | Biehl |
|---|---|---|
| 5,659,270 A | 8/1997 | Millen |

(Continued)

FOREIGN PATENT DOCUMENTS

| EP | 0496583 A2 | 7/1992 |
|---|---|---|
| WO | 2009-045576 A2 | 4/2009 |
| WO | 2015-072985 A1 | 5/2015 |

OTHER PUBLICATIONS

From U.S. Appl. No. 16/269,847, Office Action dated Apr. 27, 2020.
(Continued)

*Primary Examiner* — Graham P Smith
(74) *Attorney, Agent, or Firm* — Ladas & Parry

(57) ABSTRACT

A RF antenna or sensor comprising substrate with at least a pair of resonators bonded thereto, whereon a first one of the at least a pair of resonators is coated with a magnetostrictive film and a second one of the at least a pair of resonators is not coated with a magnetostrictive film. The resonators are preferably connected to sustaining circuits to form oscillators and the oscillators a preferably used within a phase lock loop to detect the magnetic component of an incident RF field with a bandwidth determined by the phase lock loop. Also disclosed is a method of making a RF sensor or antenna comprises providing a substrate of a semiconductor material, simultaneously forming two resonators on the substrate, and during the forming of the resonators a resist coating partially covering a first one of the resonators and completely covering a second one of the resonators is applied. Then, a magnetostrictive material is deposited to regions not covered by the resist coating. Thereafter, the resist coating is removed thereby leaving the magnetostrictive material deposited on only one of the two resonators.

21 Claims, 5 Drawing Sheets

(51) Int. Cl.
*H03H 9/22* (2006.01)
*G01R 33/02* (2006.01)
*H03L 7/08* (2006.01)
*H03B 5/32* (2006.01)
*H03B 5/40* (2006.01)
*H03H 9/205* (2006.01)

(52) U.S. Cl.
CPC ............ *H03B 5/40* (2013.01); *H03H 9/205* (2013.01); *H03H 9/22* (2013.01); *H03L 7/08* (2013.01)

(56) References Cited

U.S. PATENT DOCUMENTS

| | | | |
|---|---|---|---|
| 5,962,786 | A | 10/1999 | Le Traon |
| 6,194,900 | B1 | 2/2001 | Freeman |
| 6,483,480 | B1 | 11/2002 | Sievenpiper |
| 6,812,903 | B1 | 11/2004 | Sievenpiper |
| 6,888,424 | B2 | 5/2005 | Takeuchi |
| 7,575,807 | B1 | 8/2009 | Barvosa-Carter |
| 7,716,985 | B2 | 5/2010 | Zhang |
| 7,750,535 | B2 | 7/2010 | Kubena |
| 7,774,155 | B2 | 8/2010 | Sato |
| 7,851,971 | B2 | 12/2010 | Chang |
| 7,892,630 | B1 | 2/2011 | McKnight |
| 7,892,876 | B2 | 2/2011 | Mehregany |
| 8,390,387 | B2 | 3/2013 | Lander |
| 8,760,157 | B2 | 6/2014 | Miller |
| 8,765,615 | B1 | 7/2014 | Chang |
| 8,803,751 | B1 | 8/2014 | Miller |
| 8,912,711 | B1 | 12/2014 | Chang |
| 9,211,690 | B1 | 12/2015 | McKnight |
| 9,250,074 | B1 | 2/2016 | Kubena |
| 9,250,452 | B1 | 2/2016 | Yap |
| 9,383,208 | B2 | 7/2016 | Mohanty |
| 9,825,610 | B1 | 11/2017 | Churchill |
| 9,879,997 | B1 | 1/2018 | Kubena |
| 9,977,097 | B1 | 5/2018 | Nguyen |
| 9,991,863 | B1 | 6/2018 | Kubena |
| 10,031,191 | B1 | 7/2018 | Nguyen |
| 10,110,198 | B1 | 10/2018 | Kubena |
| 10,126,376 | B1 | 11/2018 | Nguyen |
| 10,175,307 | B1 | 1/2019 | Sorenson |
| 10,177,737 | B1 | 1/2019 | Kubena |
| 10,266,398 | B1 | 4/2019 | Kubena |
| 10,308,505 | B1 | 6/2019 | Kirby |
| 10,389,392 | B1 | 8/2019 | Kubena |
| 2002/0166379 | A1 | 11/2002 | Paros |
| 2004/0194548 | A1 | 10/2004 | Dayagi |
| 2004/0263408 | A1 | 12/2004 | Sievenpiper |
| 2005/0082944 | A1 | 4/2005 | Thompson |
| 2005/0122115 | A1 | 6/2005 | Maguire |
| 2005/0174014 | A1 | 8/2005 | Korden |
| 2006/0160136 | A1 | 7/2006 | Xiang |
| 2007/0001773 | A1 | 1/2007 | Oxborrow |
| 2007/0017287 | A1 | 1/2007 | Kubena |
| 2007/0082642 | A1 | 4/2007 | Hattori |
| 2007/0180911 | A1 | 8/2007 | Shoji |
| 2007/0205849 | A1 | 9/2007 | Otis |
| 2007/0216406 | A1 | 9/2007 | Witcraft |
| 2008/0136418 | A1 | 6/2008 | Renz |
| 2008/0163689 | A1 | 7/2008 | Thompson |
| 2009/0003136 | A1 | 1/2009 | Karr |
| 2009/0109048 | A1 | 4/2009 | Spivak |
| 2009/0147254 | A1 | 6/2009 | Kirby |
| 2010/0176809 | A1 | 7/2010 | Biber |
| 2011/0062955 | A1 | 3/2011 | Miller |
| 2013/0201316 | A1 | 8/2013 | Binder |
| 2013/0217979 | A1 | 8/2013 | Blackadar |
| 2014/0111019 | A1 | 4/2014 | Roy |
| 2014/0113828 | A1 | 4/2014 | Gilbert |
| 2015/0295320 | A1 | 10/2015 | Lee |
| 2015/0323694 | A1 | 11/2015 | Roy |
| 2016/0003924 | A1 | 1/2016 | Sun |
| 2016/0118954 | A1 | 4/2016 | Clark |
| 2016/0209478 | A1 | 7/2016 | Forstner |
| 2016/0380357 | A1 | 12/2016 | Keller |
| 2017/0141622 | A1 | 5/2017 | Meichle |
| 2017/0212060 | A1 | 7/2017 | Hao |
| 2017/0244377 | A1 | 8/2017 | Yamane |
| 2017/0276848 | A1 | 9/2017 | Sinclair |
| 2017/0345449 | A1 | 11/2017 | Shibata |
| 2017/0359025 | A1 | 12/2017 | Kishi |
| 2018/0040666 | A1 | 2/2018 | Shibata |
| 2018/0057409 | A1 | 3/2018 | Rosseinsky |
| 2018/0083595 | A1 | 3/2018 | Kaida |
| 2018/0115070 | A1 | 4/2018 | Wang |
| 2018/0198211 | A1 | 7/2018 | Wall |
| 2018/0226720 | A1 | 8/2018 | Wall |
| 2018/0248516 | A1 | 8/2018 | Nota |
| 2018/0302032 | A1 | 10/2018 | Oya |
| 2018/0323768 | A1 | 11/2018 | Ikeda |
| 2019/0072374 | A1 | 3/2019 | Mann |
| 2019/0123714 | A1 | 4/2019 | Kizu |
| 2019/0245254 | A1 | 8/2019 | Yamane |

OTHER PUBLICATIONS

Griffith, W.C. et. al., "Miniature atomic magnetometer integrated with flux concentrators," Applied Physics Letters 94, 023502 (2009) (3 pages).

Kubena, R.L., et al. "Wide-band multiferroic quartz MEMS antennae" Journal of Physics: Conference Series, 2019, pp. 1-5.

U.S. Appl. No. 16/775,242, filed Jan. 28, 2020, Kubena.

From U.S. Appl. No. 15/801,642 (unpublished, non-publication request filed), Notice of Allowance dated Apr. 5, 2019.

From U.S. Appl. No. 15/801,642 (unpublished, non-publication request filed), Notice of Allowance dated Jan. 29, 2019.

From U.S. Appl. No. 15/801,642 (unpublished, non-publication request filed), Notice of Allowance dated Dec. 19, 2018.

From U.S. Appl. No. 15/801,642 (unpublished, non-publication request filed), Office Action dated Jun. 14, 2018.

U.S. Appl. No. 15/801,642, filed Nov. 2, 2017, Kubena.

U.S. Appl. No. 15/965,652, filed Apr. 27, 2018, Kubena.

U.S. Appl. No. 16/269,847, filed Feb. 7, 2019, Kubena.

U.S. Appl. No. 15/899,122, filed Feb. 19, 2018, Kubena.

Azad, U., et al., "Direct Antenna Modulation (DAM) for Enhanced Capacity Performance of Near-Field Communication (NFC) Link," IEEE Transactions on Circuits and Systems—I: Regular Papers vol. 61, No. 3, pp. 902-910, Mar. 2014.

Bennett, S.P., et al., "Magnetic Field Response of Doubly Clamped Magneto-Electric Microelectromechanical AlN—FeCo Resonators," Applied Physics Letters 111, 2017, 5 pages.

Filter Inductors—1812FS Series Datasheet, Oct. 12, 2015, retrieved online at: www.coilcraft.com/pdfs/1812fs.pdf.

Gamble, J.T., "Wideband Coherent Communication at VLF with the Experimental Transmitting Antenna Modulator (ETAM)," No. RADC-TR-73-287, Rome Air Development Center, Air Force Systems Command, Griffiss Air Force Base, NY, Dec. 1973.

Hansen, R.C. et al., "Small Antenna Handbook," John Wiley & Sons, Inc., 2011, Chapter 3.

Hu, Z. et al., "Voltage Control of Magnetism in FeGaB/PIN-PMN-PT Multiferroic Heterostructure for High-Power and High-Temperature Applications," Applied Physics Letters, 106, 022901 (2015), 4 pages.

Kawashima, H., "New Cuts for Width-Extensional Mode Quartz Crystal Resonators," Electronics & Communications in Japan, Part 3, vol. 76, No. 12, pp. 28-36, Apr. 1993.

Kim, H.J. et al., "Piezoelectric/Magnetostructure MEMS Resonant Sensor Array for in-Plane Multi-Axis Magnetic Field Detection," IEEE MEMS 2017.

Kirby, et al. "Miniaturized VHF Quartz MEMs Resonator Design Methodology," 2017 Frequency Control Symposium, Jul. 10-13, 2017, Besancon, France.

(56) References Cited

OTHER PUBLICATIONS

Klemmer, T.J. et al., "Ultrahigh Frequency Permeability of Sputtered Fe—Co—B Thin Films," Journal of Applied Physics, vol. 87, No. 2, Jan. 15, 2000.

Kubena, R. "UHF Quartz MEMS Oscillators for Dynamics-Based System Enhancements," 2013 IEEE International Frequency Control Symposium, Prague, Czech Republic, Jul. 22-26, 2013 (8 pages).

Kubena, R., et al., "A Fully Integrated Quartz MEMS VHF TCXO," 2017.

Kubena, R., et al., "MEMS-based UHF Monolithic Crystal Filters for Integrated RF Circuits," Journal of Microelectromechanical Systems, vol. 25, No. 1, pp. 118-124, Feb. 2016.

Kubena, R., et al., "Next Generation Quartz Oscillators and Filters for VHF-UHF Systems," 2006 IEEE International Microwave Symposium, San Francisco, CA, Jun. 11-16, 2006, pp. 668-671.

Li, M. et al., "Ultra-Sensitive MEMS Magnetoelectric Sensor for Picotesla DC Magnetic Field Detection" MEMS 2017, Applied Physics Letter, 110 (2017).

Liang, C-Y et. al.,"Modeling of Magnetoelastic Nanostructures with a Fully Coupled Mechanical-Micromagnetic Model," Nanotechnology 25 (2014).

Nan, T. et al., "Acoustically Actuated Ultra-Compact NEMS Magnetoelectric Antennas," Nature Communications, 8:296 (2017).

Statek, CX1SM Crystal Datasheet, first accessed Mar. 14, 2016.

Ungan, T., et al., "RF Energy Harvesting Design Using High Q Resonators," IEEE MTT-S International Microwave Workshop on Wireless Sensing, Local Positioning, and RFID, IMWS 2009, pp. 1-4. IEEE, 2009 (4 pages).

Vrba, J., *SQUID Sensors: Fundamentals, Fabrication and Applications*, edited by H. Weinstock Kluwer Academic, Dordrecht, The Netherlands, 1996 p. 117.

Yao, Zhi, et al.,"Bulk Acoustic Wave Mediated Multiferroic Antennas: Architecture and Performance Bound," IEEE Transactions on Antennas and Propagation, vol. 63, No. 8, Aug. 2015, pp. 3335-3344.

Zhai, J. et al., "Detection of Pico-Tesla Magnetic Fields using Magnetic-Electric Sensors at Room Temperature," Applied Physics Letters 88, (2006).

From U.S. Appl. No. 16/269,847 (now published as US 2019-0250198 A1), Office Action dated Oct. 17, 2019.

BROADBAND INTEGRATED RF MAGNETIC ANTENNA

CROSS REFERENCE TO RELATED APPLICATIONS

This application claims the benefit U.S. Provisional Patent Application Ser. No. 62/678,897, filed 31 May 2018 and entitled "Broadband Integrated RF Magnetic Antenna", the disclosure which is hereby incorporated herein by reference.

This application is related to U.S. patent application Ser. No. 15/965,652, filed 27 Apr. 2018 and entitled "A Quartz MEMS Piezoelectric Resonator for Chipscale RF Antennae" and to its Provisional Application Ser. No. 62/521,174 filed Jun. 16, 2017. This application is also related to U.S. patent application Ser. No. 16/269,847, filed 7 Feb. 2019 and entitled "A Dual Magnetic and Electric Field Sensor" and to its Provisional Application Ser. No. 62/628,612 filed 9 Feb. 2018. The disclosures of each of the aforementioned US Patent Applications are hereby incorporated herein by reference.

This application is also related to U.S. Provisional Patent Application Ser. No. 62/826,757, filed on the same date as this application and entitled "A femto-Tesla MEMS RF Antenna with Integrated Flux Concentrator", the disclosure which is hereby incorporated herein by reference.

STATEMENT REGARDING FEDERALLY SPONSORED RESEARCH OR DEVELOPMENT

None.

TECHNICAL FIELD

This invention relates to broadband integrated RF magnetic antennas.

BACKGROUND

Magnetostrictively-driven piezoelectric resonators offer the possibility of sensing magnetic RF fields with high sensitivity with extreme sub-wavelength (>>λ) structures and at room temperature. See T. Nan, et. al., "Acoustically Actuated Ultra-Compact NEMS Magnetoelectric Antenna," *Nature Communications*, 8:296, DOI: 10.1038/s41467-017-00343-8 (2017) and J. Zhai, et. al., "Detection of Pico-Tesla Magnetic Fields using Magneto-Electric Sensors at Room Temperature," *Applied Physics Letters*, 88, 062510 (2006). The sensitivity is enhanced by the high mechanical gain (Q) of the resonator. Currently, there is hope that these devices can achieve noise floors similar to superconducting quantum-based (SQUID) devices (~5 fT/rt Hz) which require cryogenic cooling to 4.2 K. See J. Vrba, *SQUID Sensors: Fundamentals, Fabrication and Applications*, edited by H. Weinstock Kluwer Academic, Dordrecht, The Netherlands, 1996 p. 117. However, sensing the amplitude modulation of the voltage generated by a high-Q piezoelectric transducer limits the bandwidth of operation to roughly the linewidth of the mechanical resonance.

Detecting extremely small RF signals typically is accomplished by use of dipole or monopole antennas whose length (2h) is roughly one-half to one-quarter of the RF wavelength. For smaller antenna, the radiation efficiency η drops drastically ~$h^2$. See: R. C. Hansen & R. E. Collin, "Small Antenna Handbook", John Wiley & Sons Inc., 2011. The radiation efficiency is given by the following formula:

$$\eta = \frac{20k^2h^2}{20k^2h^2 + \frac{120}{Q_L}\left[1 - \ln\left(\frac{h}{a}\right)\right]\cot(kh)},$$

where k is the free space wavenumber, h is half the length of the dipole, $Q_L$ is the quality factor of the inductive matching element, and a is the radius of the dipole wire. Hence, these dimensional restrictions limits the system size reduction for VHF and lower frequency signals. In addition, the detection of the magnetic component of the RF field is advantageous for eliminating ground plane issues for highly integrated antennas. Hence, a highly sensitive, small, low-power, AC magnetic sensor is needed.

The RF signal strengths detected for optimized electric-field driven antennas for commercial radios correspond to detecting femto-to-pico tesla (pT –fT) magnetic fields. This level of direct magnetic detection is currently only achievable using cryogenically cooled SQUID detectors, larger flux gate sensors, or optically pumped magnetometers. All these sensors are difficult to miniaturize on chip and require high powers to operate (≥195 mW).

Thus, there is a need for new types of RF magnetic sensors that are very much smaller than the RF wavelength of the field to be sensed, can preferably be integrated on a single substrate, preferably consume only several mW of power, preferably have high bandwidth for high content communication signals, preferably have low temperature sensitivities, and preferably have high detection sensitivities. The use of room-temperature high-Q quartz MEMS resonators integrated with low-power Si electronics coupled with high permeability magnetostrictive films for strain-induced frequency modulation can provide a path for miniaturization, low power, and high sensitivity (see U.S. patent application Ser. No. 15/965,652, filed 27 Apr. 2018 for "A Quartz MEMS Piezoelectric Resonator for Chipscale RF Antennae" noted above). This application describes an antenna structure to increase the bandwidth and reduce the temperature sensitivity below the level already afforded by the use of temperature-compensated quartz. Bandwidth limitations is one major concerns for previously reported resonant-based sensors.

Three universities, which are believed to be actively researching in this area, are UCLA, Northeastern University, and Virginia Tech. Each have published in this area. See, for example, Zhi Yao, et al., "Bulk Acoustic Wave Mediated Multiferroic Antennas: Architecture and Performance Bound," *IEEE Transactions on Antennas and Propagation*, Vol. 63, August 2015, pp. 3335-3344; Tianxiang Nan, et al., "Acoustically Actuated Ultra-Compact NEMS Magnetoelectric Antennas," *Nature Communications*, 8:296 (DOI: 10.1038/541467-017-00343-8); Junyi Zhai, et al., "Detection of Pico-Tesla magnetic Fields using Magneto-electric Sensors at Room Temperature," *Applied Physics Letters*, vol. 88 (2006) (DOI: 10.1063/1.2172706). The UCLA experimental work has involved using YIG/ZnO BAW and SAW resonators with FeCoB magnetostrictive films. The Northeastern Univ. group have used AlN resonators with FeGaB magnetostrictive films. The Virginia Tech work involved Terfenol-D plates bonded with adhesives to PZT piezoelectric plates. The UCLA and Northeastern piezoelectric devices had Qs ≤1000 in the VHF to UHF bands, and as stated above had high temperature sensitivities. Most all of these groups have studied the direct conversion of the magnetic field to a piezoelectrically produced voltage. However, recently, NRL/Univ. of Penn./Carnegie Mellon have published results of a AlN—FeCo magnetic sensor in which a frequency shift was used to detect low frequency applied magnetic fields. See S. P. Bennett, et. al., "Magnetic Field Response of Doubly Clamped Magneto-Electric Microelectromechanical AlN—FeCo Resonators," *Applied Physics Letters* 111, 252903 (2017). The frequency shift is produced by the change in the elastic modulus of the resonator as a function of the applied magnetic field and resulting stress.

Quartz MEMS resonators manufactured by HRL Laboratories of Malibu, Calif. (HRL) have demonstrated Qs from 200,000 to 10,000 in these frequency ranges and have temperature stability which are typical of AT-cut quartz resonators (several ppm over temperature). In addition, many HRL manufactured quartz resonators have inherent resistance of <100 ohms which allows arrays of resonators to be connected in series for higher signal/noise. Novel quartz resonator designs are also described which can decouple the magnetostrictive films from the piezoelectric resonator for maintaining high Q even with the application of thick (~1 micron) magnetostrictive films. See, for example, the following documents for a description of the HRL quartz MEMS process:

1. R. L. Kubena, F. P. Stratton, D. T. Chang, R. J. Joyce, and T. Y. Hsu, "Next Generation Quartz Oscillators and Filters for VHF-UHF Systems," 2006 *IEEE International Microwave Symposium*, San Francisco, Ca., Jun. 11-16, 2006.
2. R. L. Kubena, D. J. Kirby, Yook-Kong Yong, D. T. Chang, F. P. Stratton, H. D. Nguyen, R. J. Joyce, R. Perahia, H. P. Moyer, and R. G. Nagele "UHF Quartz MEMS Oscillators for Dynamics-Based System Enhancements,", 2013 *IEEE International Frequency Control Symposium*, Prague, Czech Republic, Jul. 22-26, 2013.
3. R. L. Kubena, F. P. Stratton, H. D. Nguyen, D. J. Kirby, D. T. Chang, R. J. Joyce, Y. K. Yong, J. F. Garstecki, M. D. Cross, and S. E. Seman, "A Fully Integrated Quartz MEMS VHF TCXO," 2017 *IEEE Frequency Control Symposium*, Besancon, Fr., pp. 68-71, July 2017.

In this disclosure, we utilize quartz MEMS resonators coupled with electronics for accurately determining the frequency shift at high frequencies through the use of a phase lock loop (PLL) using a magnetically and non-magnetically sensitive set of resonators. The HRL quartz MEMS process described in the documents noted above and also below allows the electronics for the PLL to be integrated in a common substrate as the bonded resonators. This then provides for a complete magnetic sensor chip for high bandwidth applications which does not require external electronics. In addition, the use of similar quartz resonators for the magnetically and non-magnetically sensitive clocks within the PLL provides for additional temperature insensitivity beyond that of the temperature-compensated quartz, thus reducing the drift and noise for low frequency applications.

BRIEF DESCRIPTION OF THE INVENTION

Herein we describe a room temperature magnetic RF quartz resonator (sensor) which can be operated over a much larger bandwidth compared to a passive magnetostrictively driven resonator and which can be integrated on a single semiconductor substrate. Two quartz resonators are wafer-level bonded on a single active semiconductor substrate containing electronics for two oscillators and for phase locking the frequency of a magnetostrictively frequency-modulated resonator to a reference voltage-controlled quartz oscillator. (In a separate embodiment, the magnetostrictively frequency-modulated oscillator could be configured with VCO electronics and the non-magnetically coated resonator/oscillator could be a fixed frequency reference.) The error signal to the reference oscillator generated by the phase lock loop (PLL) then replicates the incident magnetic component of the RF magnetic signal and can be modulated with bandwidths approaching the RF carrier. Thus, the bandwidth of the antenna is determined by the bandwidth of the PLL and not the Q of the resonators. However, high Q resonators are still important to reduce the phase noise of the PLL and hence provide high antenna sensitivities. Since the two resonators are located in close proximity to each other on the same substrate, the two resonators will sense similar temperature variations, and this will reduce the temperature sensitivity of the sensor for low frequency applications.

In one aspect the present invention provides A RF antenna (or RF sensor) comprising a substrate with at least a pair of resonators bonded thereto, wherein a first one of the at least a pair of resonators is at least partially coated with a magnetostrictive film and a second one of the at least a pair of resonators is not coated with the magnetostrictive film.

In another aspect the present invention provides a method of making a RF sensor or antenna comprising: providing a substrate of a semiconductor material, simultaneously forming two resonators on said substrate, and during the forming of the resonators applying a resist mask partially covering a first one of the resonators and completely covering a second one of the resonators, depositing a magnetostrictive material to regions not covered by said resist mask and then removing said resist coating thereby leaving the magnetostrictive material deposited to only one of said two resonators.

BRIEF DESCRIPTION OF THE DRAWINGS

FIG. 1 is perspective view while

DETAILED DESCRIPTION

Figure 1:
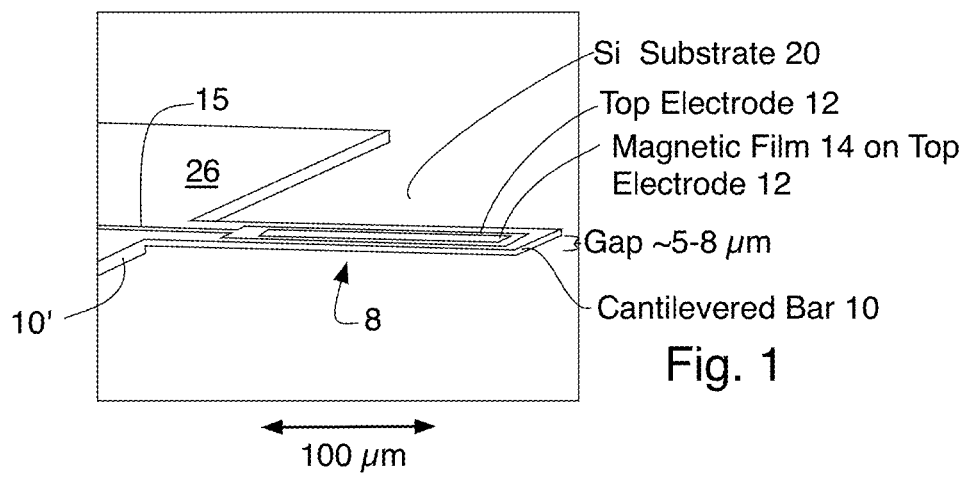

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Fabrication processes for quartz MEMS devices have been described in previous U.S. Pat. Nos. 7,750,535; 7,851,971; and 8,765,615, and in U.S. patent application Ser. No. 14/973,701 filed Dec. 17, 2015 and in U.S. Provisional Patent Application Ser. No. 62/417,111 filed on Nov. 3, 2016, the disclosures of which are hereby incorporated herein by reference. These patents and patent applications describe starting with a quartz resonator wafer and depositing top-side electrode metal and the interconnect metal for running to the bond pads. However, in the new process a magnetostrictive film such as FeGaB or FeCoB is deposited on one of a pair of resonators, preferably with a sputtering process, either soon before or soon after metallic electrodes are formed.

Figure 1A:
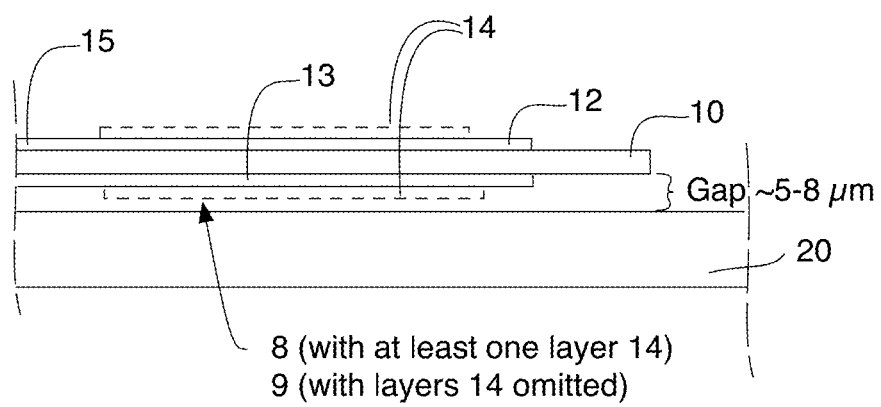
FIG. 1a is aside view of embodiments of a piezoelectric MEMS shear-mode resonator for VHF to UHF antenna applications depicting in dashed lines magnetostrictive material added to at least one of such embodiments.

The basic technique for a basic quartz shear-mode design with a magnetostrictive film 14 applied to the top electrode 12 is shown in FIGS. 1 and 1a, FIG. 1 providing a perspective view while FIG. 1a providing a side elevational view.

A resonator 8 can be made Sustaining circuits 21 and 22 sensitive to a magnetic field in the crystal's X direction if a pre-magnetization is applied in the vertical out-of-plane or in the crystal X directions to the magnetic film 14 during deposition. Resonator 8 preferably operates shear-mode and has a substrate or body 10 which is preferably formed of AT-cut quartz. If a second similar resonator 9 is fabricated near the first resonator 8 but without the magnetic film 14 (for example, a resist mask may be used to cover the second resonator 9 during the magnetic film 14 deposition if both resonator 8 and resonator 9 were formed, preferably simultaneously, during a previous bonding step), the two resonators 8, 9 can be run as oscillators with the electrodes thereof coupled with appropriate sustaining circuits 21, 22, such as Pierce or Colpitts oscillator circuits. The second resonator 9 preferably also operates shear-mode and also has a substrate or body 10 which is preferably formed of AT-cut quartz. The outputs of these two oscillators 21, 22 can be used by a Phased Locked Loop (PLL) circuit 23 to lock the frequency of the reference voltage-controlled resonator 9 to that of the magnetic sensor oscillator to ppb to ppt ($10^{-9}$ to $10^{-12}$ fractional frequency) accuracy. The reference voltage-controlled resonator 9 should, at least in principle, be insensitive to the RF field 7. The error signal generated by the PLL circuitry 23 is applied to sustaining circuit 22 and is used as an output signal for measuring a magnetic component of the incident RF field 7. Since it can be generated with high bandwidth (~100 MHz), any change in the strain in the magnetostrictive film 14 due to a change in the applied magnetic field 7 can be sensed with a high bandwidth. In operation, the resonant frequency of the resonators should be pick roughly 50-100 times higher than the magnetic RF frequency to be detected in order to allow the PLL to sufficiently integrate the phase error to high accuracy. It is also noted that several electronic methods for detecting phase errors between two signals are available to designers skilled in the art. This disclosure is intended to include any electronics method of detecting the phase difference between the frequencies of the two resonators and generating errors signals for locking the two frequencies.

The resonators 8,9 are very small in size compared to the wavelength of the magnetic field that they sense. FIG. 1 includes an arrow showing a size of 100 μm giving an indication of the size of the depicted resonator 8. The resonator of FIG. 1 can operate at frequencies in the range of 500-700 MHz with electrodes 12,13 having a length of about 150 μm and a width of about 50 μm. So the overall length of the quartz resonator 8 could well be under 200 sm. A wavelength at 500 to 700 MHz is around 0.5 m. So compared to a conventional ½ wave antenna, the resonator 8 is three to four orders of magnitude smaller than a conventional ½ or ¼ wave antenna. Resonator 9 is preferably of the same overall size as resonator 8.

Figure 2:
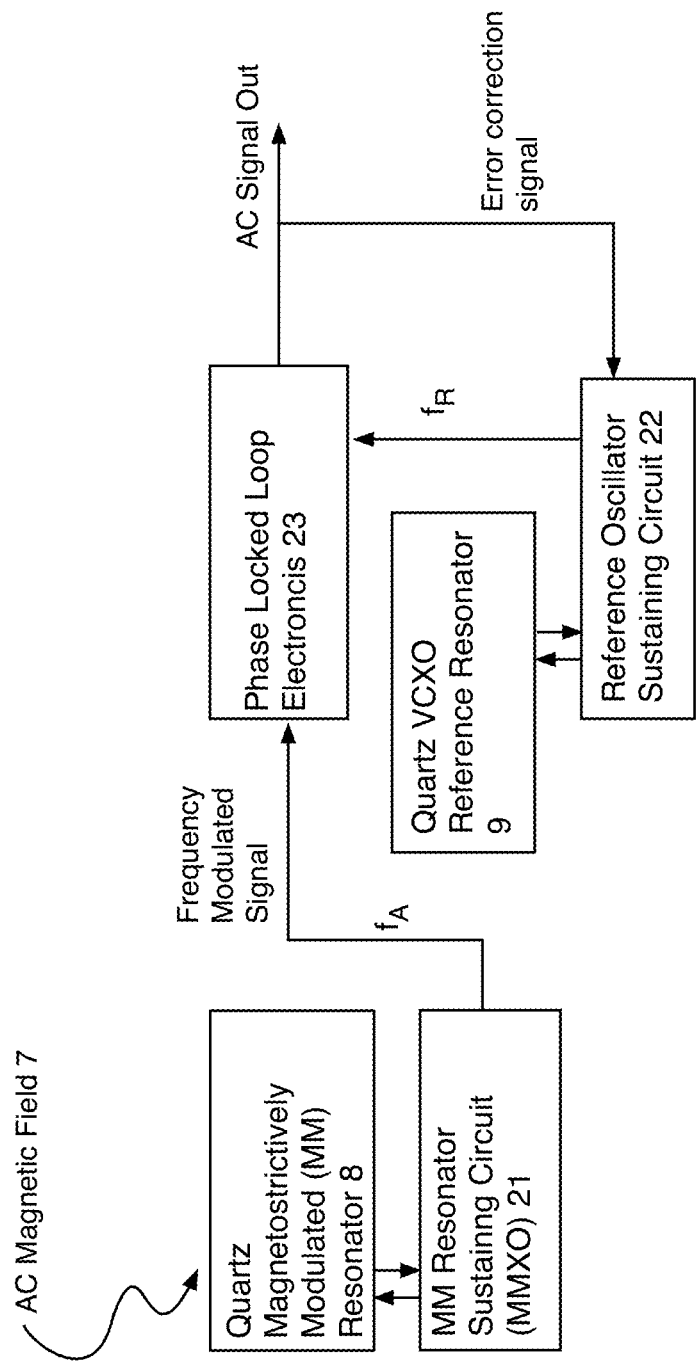
FIG. 2 depicts a circuit proposed for phase-locking a magnetostrictively-modulated quartz oscillator to a similar quartz voltage-controlled oscillator for the purpose of wide bandwidth antenna operation.

A suggested circuit architecture is shown in FIG. 2. The output signal (AC Signal Out) of the circuit of FIG. 2 may be applied to a receiver (not shown) and possibly to the LNA and/or a filter associated with such a receiver.

The resonators 8,9 each preferably comprise a cantilevered bar, substrate or body 10 of AT-cut quartz material which may be disposed over a semiconductor substrate 20 such as silicon or a group III-V semiconductor material system semiconductor and spaced therefrom by a gap preferably in a range of 5 to 8 μm. The cantilevered bar, substrate or body 10 may extend from (and be unitary with) a relatively thicker portion 10' of the quartz body 26 so that the relatively thicker portion 10' of the quartz body 26 may be affixed to the semiconductor substrate 20 while maintaining a gap between the relatively thinner cantilevered portion and the semiconductor substrate 20. The semiconductor substrate 20 preferably embodies the electronic circuits 21, 22 and 23 mentioned above as depicted in a schematic fashion by FIG. 3. The two resonators 8, 9 are depicted co-axial to each other in FIG. 3, but the relative orientation of the two resonators 8 and 9 to each other is not important. They can be oriented in any direction relative to each other since only one of the two resonators (magnetostrictive material coated resonator 8) is sensitive to the magnetic component of the incident RF field 7 while the other resonator (resonator 9) is intended to be insensitive to the magnetic component of the incident RF field 7 and is utilized as a reference oscillator.

Instead of relying of an thicker portion 10' of the body of quartz 26 to affix to the semiconductor substrate 20, the quartz resonators 8, 9 may be supported by other means including a plurality of supports or posts 11 for forming a metal alloy bond to the semiconductor substrate 20. Only one support 11 is depicted for each resonator 8, 9 in FIG. 3, but typically a pair of supports 11 would be employed, each being electrically conductive and being bonded to the semiconductor substrate 20, one being connected to the upper electrode 12 and the other being connected to the lower electrode 13 so as to couple electrodes 12,13 with the respective sustaining circuits 21 and 22 in substrate 20.

Figure 4A:
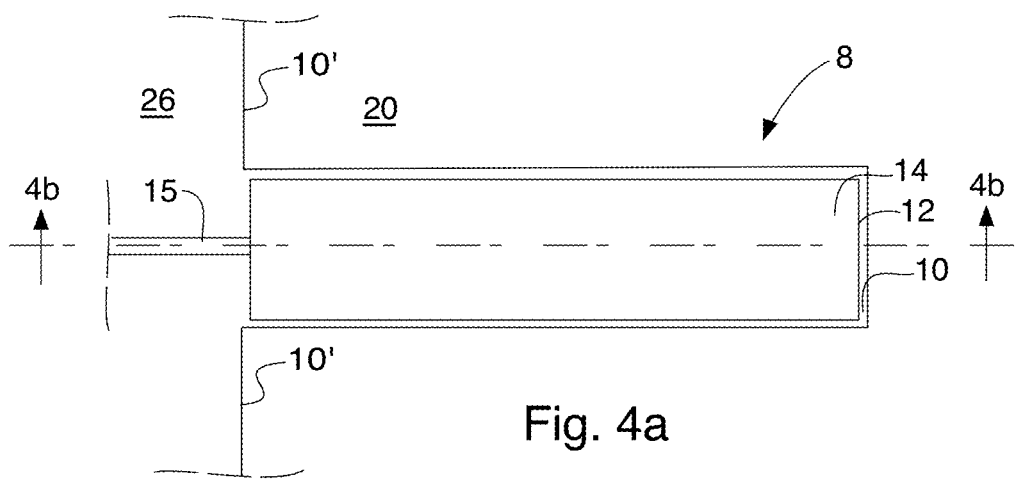
FIGS. 4a and 4b depict atop view and aside sectional view of an embodiment of a magnetically-induced piezoelectric MEMS shear-mode resonator for VHF to UHF antenna applications with magnetostrictive material added thereto, this resonator being an embodiment of one of the two resonators depicted in the embodiment of a MEMS chip-level antenna of FIG. 3.
Figure 4B:
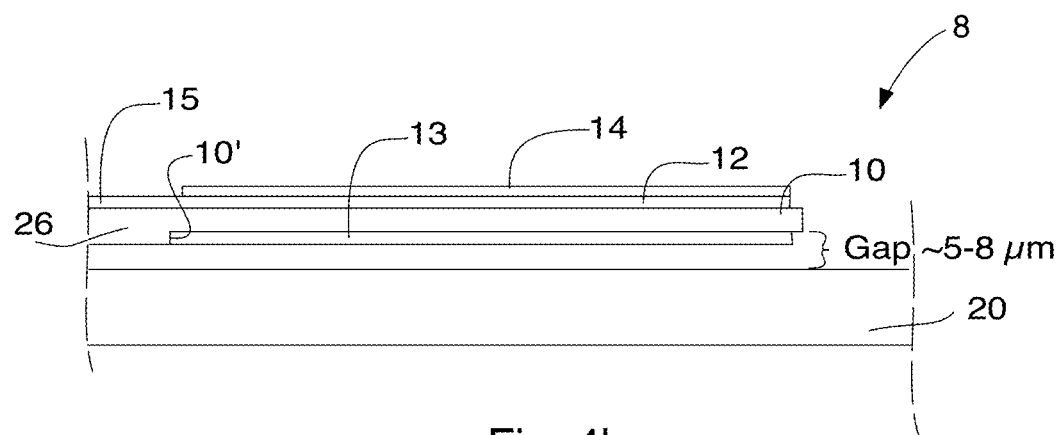

In FIG. 1 the width of the magnetostrictive material 14 is depicted of resonator as being slightly less wide than the width of the electrodes 12,13 for ease of illustration. Preferably, the magnetostrictive material 14 should be as wide as the electrodes 12,13 for maximum sensitivity as is depicted by FIGS. 4a and 4. Moreover, the longitudinal length of the magnetostrictive material 14 should preferably be as long as the electrodes 12,13 as well, for maximum sensitivity, again as is depicted by FIGS. 4a and 4b.

As previously mentioned, the resonators 8,9 preferably each have two electrodes 12 and 13 disposed thereon. Both electrodes 12,13 may be formed of Al or Au or some other electrically conductive material(s). The electrodes 12,13 each have associated conductors 15 which couple to the sustaining circuits 21, 22 mentioned above. In the case of the resonator 8, at least one of its electrodes and preferably its top electrode 12 has a layer of a magnetostrictive material film 14 disposed thereon as shown on FIGS. 1 and 1a or 4a and 4b. The lower electrode 13 of resonator 8 may optionally or alternatively be provided with a layer of a magnetostrictive material film 14 as shown on FIG. 1a. In FIGS. 4a and 4b, the magnetostrictive material film 14 may be applied to the bottom electrode 13 instead of to the top electrode 12 or may be applied to both electrodes 12 and 13.

The resonator 9 (the reference resonator) is preferably made without a magnetostrictive material film 14 on either of its electrodes 12, 13.

The magnetostrictive material film 14 maybe a ferromagnetic material which exhibits magnetostrictive (or magnetoelastic) materials, such as Ni, Terfenol-D, FeGa, FeGaB, MnZn Ferrite, FeCoB, Alfenol, and/or perhaps certain MetGlas® alloys. There are other magnetostrictive materials than those identified above which may be utilized or which may be developed in the future for film magnetostrictive material 14. It is to be understood that the discovery of new materials which are highly magnetostrictive (also called magnetoelastic in the art) is ongoing and moreover the discovery of new materials which exhibit very little magnetostrictivity is also on going. So current (and future) magnetic materials can exhibit little or relatively large amounts of magnetostrictivity. In this disclosure the term magnetostrictive material(s) or magnetostrictive material film is intended to refer to magnetic materials whose magnetostrictice strain (4) (magnetostrictivity) is at least 50 microstrains (which is approximately the value of Ni).

Figure 3:
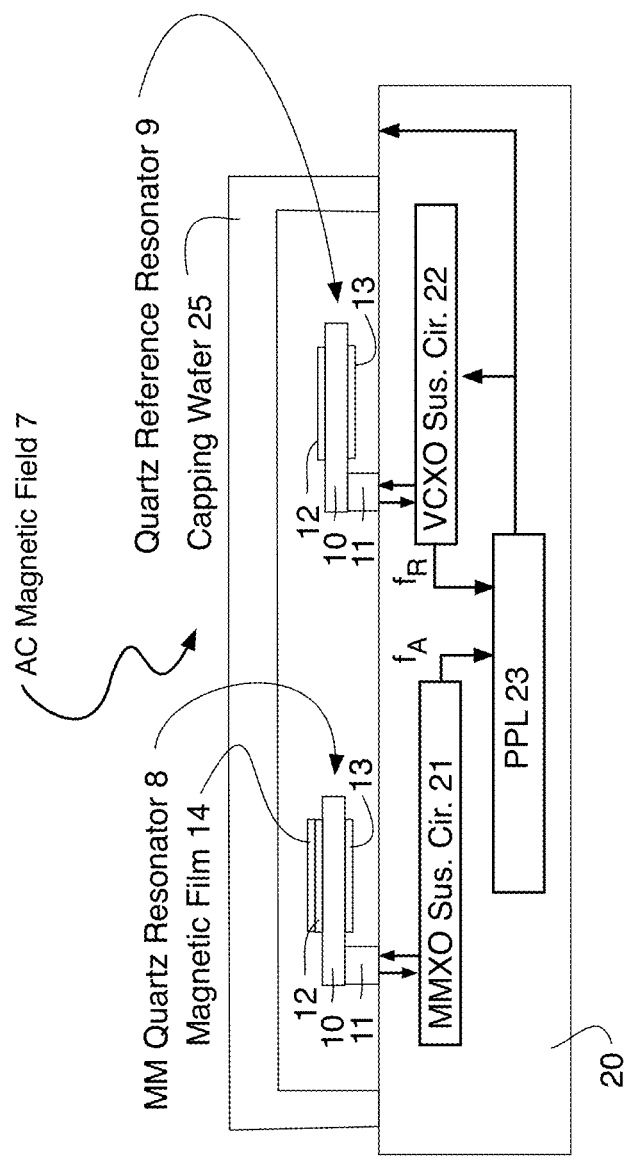
FIG. 3 depicts a fully integrated wide-bandwidth magnetostrictively-modulated quartz MEMS chip-level antenna having two resonators one of which, a piezoelectric MEMS shear-mode resonator for VHF to UHF antenna applications, includes magnetostrictive material added thereto and the other of which functions as a reference oscillator.

The circuits in FIG. 2 are preferably integrated with quartz MEMS processing on a common Si (or other semiconductor material) substrate 20 as shown in FIG. 3. For the MEMS processes noted above, the resonators 8, 9 are bonded to the substrate 20 preferably at temperatures <120° C., using, for example, bodies 11 of suitable conductive materials known in the art. Alternatively, the body of quartz 26 may have a thicker portion 10' for such bonding. The resonators 8,9 may be vacuum sealed in a housing or capping wafer 25 using either a low temperature Au/In bond of <180° C. or a Au/Sn bond with a maximum temperature of 340° C. Since for some magnetostrictive alloys such as FeGaB, the Curie temperature can be as low as 350° C. (see Z. Hu, et. al., "Voltage Control of Magnetism in FeGaB/PIN-PMN-PT Multiferroic Heterostructure for High-Power and High-Temperature Applications," Applied Physics Letters, 106, 022901 (2015)), a low temperature capping process and a low temperature bonding process (for bodies 11, for example) may be required for some magnetostrictive films 14 to prevent a pre-magnetized film from becoming de-magnetized during final processing.

Given the sizes of the resonators 8,9 mentioned above with reference to FIG. 1, the two resonators 8, 9 when disposed on substrate 20 should easily fit (along with the substrate 20) within a dimension of 1 mm by 1 mm (when viewed from the top of the of the device shown in FIG. 3) and within a cube 1 mm on each side thereof for an RF magnetic sensor or antenna that can operate in the DC to 10 MHz range. So the need for RF magnetic sensors or antennas that are very much smaller than the RF wavelength of the field to be sensed is met by the disclosed magnetic sensor or antenna of FIG. 3. Indeed, the size (length and width) of the magnetic sensor or antenna of FIG. 3 when view from the top should be at least three orders of magnitude smaller than the RF wavelength of the field 7 to be sensed. The height of the device shown in FIG. 3 should be even less. As such, the device of FIG. 3 can be sized to provide an RF antenna or sensor for sensing a RF magnetic field having a wavelength W and with an overall size (such as a cube) no greater than W times $10^{-3}$ in each of it major dimensions.

Using AT-cut or X-cut quartz resonators 8, 9, the total frequency variation over temperature of one resonator can be as low as 50 ppm. However, by combining similar resonators 8, 9 on a common substrate and using the uncoated resonator 9 as a reference for the magnetostrictive film coated resonator 8, the temperature sensitivity can be reduce to roughly <0.1 ppm. This will allow the PLL to compute error signals at high frequency with ppb accuracy while controlling much slower temperature-driven frequency drifts with much higher precision than has previously been possible. Alternatively, extensional mode quartz resonators may be used for some low frequency applications (100-1000 Hz carrier frequencies.) In that case, the magnetostrictive films 14 would be deposited between the lateral electrodes on the extensional-mode resonator which could be temperature compensated using a KT quartz cut. See U.S. Pat. No. 10,177,737 which issued on 8 Jan. 2019 and which is assigned to the assignee of the present application and entitled "High-Q Quartz-based Inductors for High Power LF Communication", the disclosure of which is hereby incorporated herein by this reference. The magnetostrictive film(s) 14 (depicted herein) would be deposited between the lateral electrodes 120a and 120b in the region labeled with numeral 114 in FIGS. 2A and/or 2C of that patent.

Figure 5:
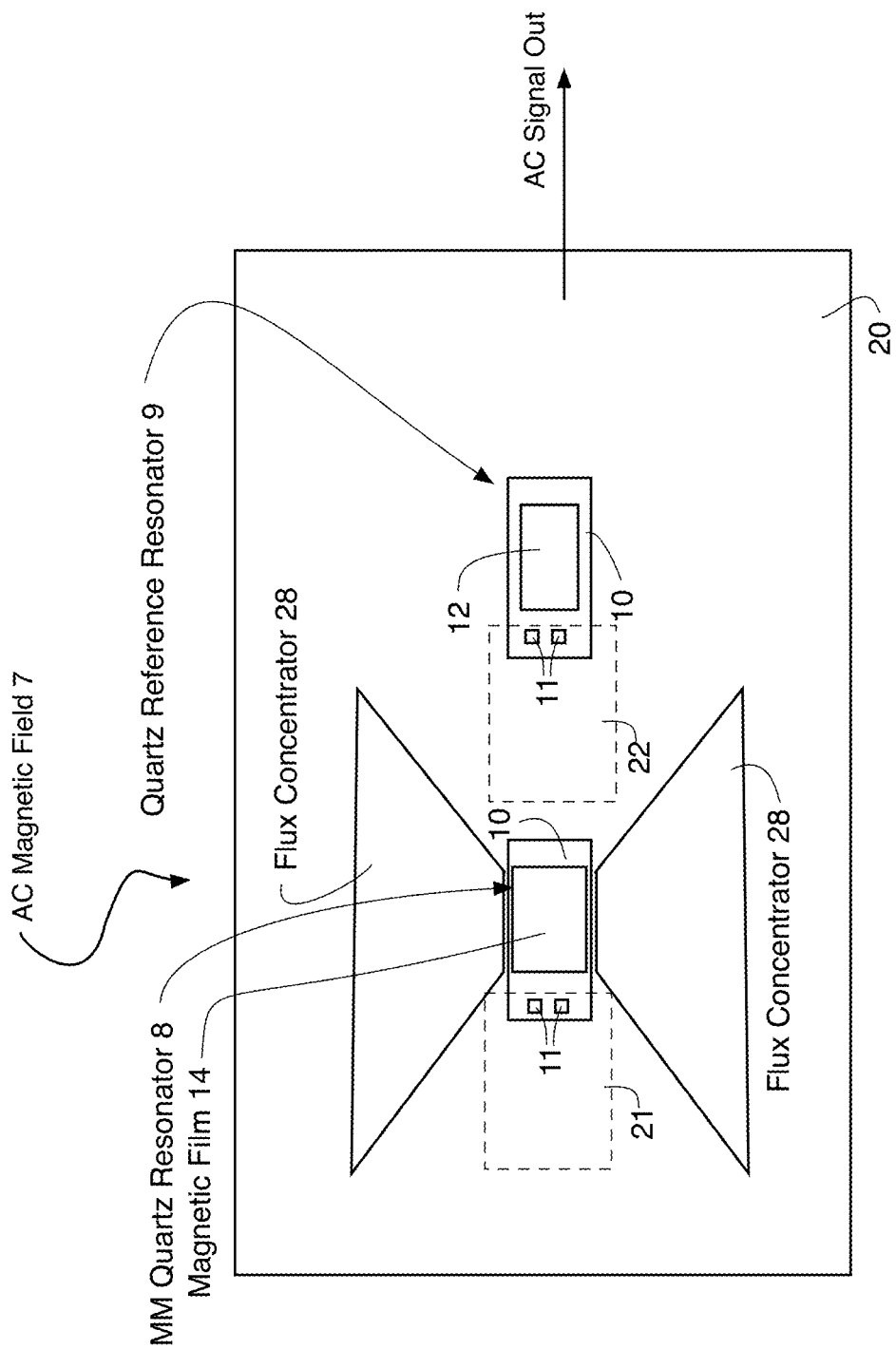
FIG. 5 is a schematic diagram depicting an embodiment similar to the embodiment of FIG. 3, but with flux concentrators added thereto to improve sensitivity to the external RF field.

FIG. 5 is a top down schematic view of another embodiment the resonators depicted in FIG. 3, but in this embodiment the resonator 8 has a pair of metallic flux concentrators or pole pieces 28 disposed very close to the magnetostrictive film 14 of resonator 8 as taught by U.S. Provisional Patent Application Ser. No. 62/826,757 filed on the same date as this application and entitled "A femto-Tesla MEMS RF Antenna with Integrated Flux Concentrator". As taught by the aforementioned US Provisional Patent Application, pole pieces 28 preferably have a relative permeability greater than 1000. The pair of high permeability pole pieces 28 are spaced apart by a gap G, the resonator 8 being disposed within gap G. The size of gap G is preferably no greater than 100 μm.

The quartz resonators 8,9 are supported above semiconductor substrate 20 by a pair of supports or posts 11 for forming a metal alloy bond to the semiconductor substrate 20. Each support or post 11 is electrically conductive and is bonded to the semiconductor substrate 20, one post being ohmically connected to the upper electrode 12 and the other being ohmically connected to the lower electrode 13 so as to couple electrodes of resonators 8 and 9 with their respective sustaining circuits 21 and 22 as depicted by FIGS. 2 and 3. Sustaining circuits 21 and 22 are preferably formed in substrate 20, along with the other circuits 23 of FIG. 2, but only the two sustaining circuits 21 and 22 are depicted by a dashed line representation thereof on FIG. 5 for the sake of clarity of representation, it being understood that sustaining circuits 21 and 22 and/or the other electronic circuits 23 of FIG. 2 may be located elsewhere (not on substrate 20) or all or some may alternatively be of a hybrid design (that is embodied as separate IC chips mounted a substrate 20 which then may not be semiconducting).

Resonator bodies 10 of a material other than AT-cut or X-cut quartz maybe utilized, if desired, (such as, for example Si, AlN materials, or PZT resonators which can couple to the magnetostriction of the magnetic film), especially if thermal stability is not an important consideration. Preferably the resonator material 10 is a piezoelectric quartz material comprising a temperature-compensated cut of crystalline quartz such as AT-cut crystalline quartz.

Although this disclosures describes a PLL technique for extending the bandwidth for quartz-based antenna, this same technique could be applied to other resonator types such as Si, AlN or PZT resonators.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. All elements, parts and steps described herein are preferably included. It is to be understood that any of these elements, parts and steps may be replaced by other elements, parts and steps or deleted altogether as should now be apparent to those skilled in the art having read this disclosure. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . ."

Modifications, additions, or omissions maybe made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A RF antenna or sensor comprising a substrate with at least a pair of resonators bonded thereto, whereon a first one of the at least a pair of resonators is at least partially covered or coated with a magnetostrictive film and a second one of the at least a pair of resonators is not coated with a magnetostrictive film.

2. A RF antenna or sensor of claim 1 in which the at least a pair of resonators are integrated to the substrate using a metal alloy bond.

3. A RF antenna or sensor of claim 2 in which the at least a pair of resonators each comprise a piezoelectric quartz material.

4. A RF antenna or sensor of claim 3 wherein the piezoelectric quartz material is a temperature-compensated cut of crystalline quartz.

5. A RF antenna or sensor of claim 3 wherein the piezoelectric quartz material is an AT-cut crystalline quartz.

6. A RF antenna or sensor of claim 1 in which the substrate comprises a semiconductor material.

7. A RF antenna or sensor of claim 1 in which the at least a pair of resonators are connected to electronics forming at least a pair of sustaining circuits, each of the at least a pair of resonators being connected to a respective one of each of the at least a pair of sustaining circuits.

8. A RF antenna or sensor of claim 7 in which the electronics for the sustaining circuits for the resonators are located in the substrate.

9. A RF antenna or sensor of claim 1 in which the magnetostrictive film consists of ferromagnetic material such as FeGaB or FeCoB.

10. A RF antenna or sensor of claim 1 in which the magnetostrictive film consists of ferromagnetic material having a magnetostrictivity at least as great as Ni.

11. A RF antenna or sensor of claim 7 in which the sustaining circuit for the second one of the at least a pair of resonators is configured to operate as a voltage controlled oscillator (VCXO).

12. A RF antenna or sensor of claim 7 in which the sustaining circuit for the first one of the at least a pair of resonators is configured to operate as a voltage controlled oscillator (VCXO).

13. A RF antenna or sensor of claim 8 in which the outputs of the sustaining circuits are used as an input to phase detection electronics.

14. A RF antenna or sensor of claim 11 in which the outputs of the sustaining circuits are used as an input to a phase locked loop (PLL) for locking the voltage controlled oscillator to a frequency of the first one of the at least a pair of resonators.

15. A RF antenna or sensor of claim 12 in which the outputs of the sustaining circuits are used as an input to a phase locked loop (PLL) for locking the voltage controlled oscillator to a frequency of the second one of the at least a pair of resonators.

16. A RF antenna or sensor of claim 12 in which the error signal generated by the phase lock loop is applied to the first one of the at least a pair of resonators and is used as an output signal for measuring a magnetic component of an incident RF field.

17. A RF antenna or sensor of claim 11 in which the error signal generated by the phase lock loop (PLL) is applied to the second one of the at least a pair of resonators and is used as an output signal for measuring a magnetic component of an incident RF field.

18. A RF antenna or sensor of claim 14 in which phase locked loop electronics and the sustaining circuits for the resonators are located in said substrate.

19. A RF antenna or sensor of claim 1 in which the first one of the at least a pair of resonators and the second one of the at least a pair of resonators are hermetically encapsulated a common housing.

20. A RF antenna or sensor of claim 19 wherein the housing comprises a semiconductor wafer bonded to the substrate, the semiconductor wafer of the housing comprising the same semiconductor material as the substrate.

21. A RF antenna or sensor of claim 1 for sensing a RF magnetic field with a wavelength W and having an overall size no greater than W times $10^{-3}$ in each of its major dimensions.

* * * * *